(12) United States Patent  (10) Patent No.: US 9,484,481 B2
Kondo et al.  (45) Date of Patent: Nov. 1, 2016

(54) RADIOGRAPH DETECTOR AND METHOD FOR MANUFACTURING THE SAME

(71) Applicant: Konica Minolta Inc., Tokyo (JP)

(72) Inventors: Masashi Kondo, Hachioji (JP); Hiromichi Shindou, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/800,039

(22) Filed: Jul. 15, 2015

(65) Prior Publication Data

US 2016/0041272 A1   Feb. 11, 2016

(30) Foreign Application Priority Data

Aug. 8, 2014  (JP) ................. 2014-162659

(51) Int. Cl.
*G01T 1/20* (2006.01)
*H01L 31/08* (2006.01)
*H01L 31/0232* (2014.01)
*G01T 1/202* (2006.01)
*H01L 27/146* (2006.01)

(52) U.S. Cl.
CPC .............. *H01L 31/085* (2013.01); *G01T 1/20* (2013.01); *G01T 1/202* (2013.01); *G01T 1/2018* (2013.01); *H01L 27/14625* (2013.01); *H01L 27/14663* (2013.01); *H01L 31/02322* (2013.01)

(58) Field of Classification Search
CPC ....... G01T 1/20; G01T 1/2018; G01T 1/202; H01L 31/02322; H01L 31/085
USPC .............................................. 250/361 R, 366
See application file for complete search history.

(56) References Cited

U.S. PATENT DOCUMENTS 6,232,611 B1 * 5/2001 Suzuki ..................... G21K 4/00
250/483.1
6,465,794 B1 * 10/2002 Suzuki ..................... G21K 4/00
250/484.4
6,974,959 B1 * 12/2005 Thoms ..................... G21K 4/00
250/250

FOREIGN PATENT DOCUMENTS

JP          4307127 B2    5/2009
JP       2012189487 A    10/2012
JP       2012202831 A    10/2012

* cited by examiner

*Primary Examiner* — Yara B Green
*Assistant Examiner* — Meenakshi Sahu
(74) *Attorney, Agent, or Firm* — Lucas & Mercanti, LLP (57) ABSTRACT

A radiograph detector includes: a fluorescent layer, a bonding layer, and a light detector disposed in this order, wherein the fluorescent layer includes fluorescent particles, first binder resin, and second binder resin, and the second binder resin contains a binder polymer identical to a bonding layer forming polymer contained in the bonding layer.

6 Claims, 3 Drawing Sheets

RADIOGRAPH DETECTOR AND METHOD FOR MANUFACTURING THE SAME

The entire disclosure of Japanese Patent Application No. 2014-162659 filed on Aug. 8, 2014 including description, claims, drawings, and abstract are incorporated herein by reference in its entirety.

BACKGROUND OF THE INVENTION

1. Field of the Invention

The present invention relates to a radiograph detector used for forming a radiograph, and a method for manufacturing this radiograph detector.

2. Description of the Related Art

A radiograph such as an X-ray image has been widely used for medical condition diagnosis given in medical sites. There has emerged in recent years a digital radiograph detecting device, such as a computed radiography (CR), and a flat panel radiograph detector (flat panel detector: FPD), as typical examples of the digital radiograph detecting device. In the field of digital technologies associated with X-ray images, various studies have been currently conducted particularly for the FPD. The FPD is equipped with a scintillator panel which converts X-rays into visible light. This scintillator panel includes a fluorescent (scintillator) layer which contains an X-ray fluorescent substance characterized by a function of converting applied X-rays into visible light and emitting the light. The FPD converts a visible light image generated from the scintillator panel into an electric signal using a thin film transistor (TFT).

Gadolinium oxysulfide (GOS) has been attracting attention as a material capable of constituting the fluorescent substance included in the FPD, based on the characteristics of gadolinium oxysulfide (GOS), i.e., no harmful heavy metal such as cadmium contained, and high machinability together with excellent optical characteristics such as high sensitivity and short afterglow. Accordingly, various research and development have been also conducted for the FPD containing a gadolinium oxysulfide (GOS) fluorescent substance as a fluorescent substance to be incorporated in the FPD.

The FPD which contains the gadolinium oxysulfide (GOS) fluorescent substance typically includes a fluorescent layer constituted by a gadolinium oxysulfide (GOS) fluorescent substance and disposed adjacent to a photoelectric conversion element panel via a bonding layer.

However, in case of the FPD configured to contain the fluorescent layer disposed adjacent to the photoelectric conversion element panel via the bonding layer, including the case of the FPD which contains a gadolinium oxysulfide (GOS) fluorescent substance as a fluorescent substance, delamination between the bonding layer and the fluorescent layer may occur due to insufficient bonding strength therebetween. In this case, durability of the FPD deteriorates. There is a type of FPD which contains a plurality of layers constituting a fluorescent layer. In this case, delamination between the plurality of layers may occur in addition to the foregoing delamination between the bonding layer and the fluorescent layer. For overcoming this problem of bonding strength, various ideas have been developed and proposed.

For example, JP 2012-189487 A discloses a radiographic imaging apparatus which includes a sensor panel, a scintillator panel, and a reinforcing plate in this order. According to this radiographic imaging apparatus, a second bonding layer disposed between the scintillator panel and the reinforcing plate is smaller in size than a first bonding layer disposed between the scintillator panel and the sensor panel. According to the description of the radiographic imaging apparatus disclosed in JP 2012-189487 A, stress produced by a difference between thermal expansion coefficients of a support substrate constituting the scintillator panel, and a sensor substrate constituting the sensor panel does not concentrate on an edge of the first bonding layer. Accordingly, delamination at the edge of the scintillator from the sensor panel caused by the stress is avoidable.

On the other hand, as a technology paying attention to an adhesive layer, JP 2012-202831 A discloses a radiograph detecting device which includes a radiographic conversion panel, an adhesive layer, and a sensor panel. The radiographic conversion panel contains a fluorescent substance, and a protection film for covering a fluorescence emitting surface of the fluorescent substance. According to the proposal described in this reference, the protection film is subjected to plasma treatment, while the adhesive layer is constituted by a hot-melt adhesive, for the purpose of improvement of both the image quality and durability of the radiograph detecting device. JP 2012-202831 A also describes that reduction of the thickness of the adhesive layer by a certain length can prevent deterioration of MTF (Modulation Transfer Function). According to JP 2012-202831 A, however, a layer constituted by column crystal such as cesium iodide is used as a fluorescent layer constituting the radiograph detecting device. Accordingly, no description is made in this reference concerning combination between the adhesive layer constituted by the hot-melt adhesive and a fluorescent layer constituted by fluorescent particles applied together with binder resin.

Japanese Patent No. 4307127 discloses a radiographic imaging apparatus which includes a sensor substrate containing photoelectric conversion image sensors, a fluorescent layer, and an adhesive layer disposed between the sensor substrate and the fluorescent layer, as a proposal of a technology for improving adhesion between the fluorescent layer and the adhesive layer and obtaining stable performance for a long period. According to this radiographic imaging apparatus, a binder polymer of the fluorescent layer and an adhesive layer forming polymer constituting the adhesive layer are cross-linked by a cross-linking agent contained in the adhesive layer. Japanese Patent No. 4307127 further describes the following points.

(i) The adhesive layer is chiefly constituted by an acrylic adhesive or the like, and obtained by applying application liquid which contains a mixture of a monomer mix and a cross-linking agent to a releasing film, and hardening the liquid for several hours. This adhesive layer in the form of an adhesive sheet provided with the releasing film is bonded to the fluorescent layer.

(ii) The adhesive layer thus formed is bonded to the fluorescent layer within 200 hours from formation of the adhesive layer to allow reaction between the cross-linking agent of the adhesive and binder resin of the fluorescent layer prior to dissipation of the function of the cross-linking agent. This method increases adhesion between the adhesive layer and the fluorescent layer.

(iii) After bonding between the fluorescent layer and the adhesive layer, the cross-linking agent contained in the adhesive layer is deactivated by exposure for 100 hours or longer at a temperature ranging from 20° C. to 30° C. Thereafter, the releasing film is released, and the fluorescent layer is bonded to the substrate surface of the photoelectric conversion image sensor via the adhesive layer to produce the radiographic imaging apparatus.

According to Japanese Patent No. 4307127, however, the bonding temperature at the time of bonding between the adhesive layer and the fluorescent layer lies approximately in the range from 50° C. to 80° C. Accordingly, this reference is not considered to present a technical idea of melting the chief component of the adhesive layer, and infiltrating the melted chief component into the fluorescent layer.

SUMMARY OF THE INVENTION

The present invention has been developed to solve the aforementioned problems arising from the circumstances of the conventional technologies, and an object of the present invention is to provide a radiograph detector which includes a fluorescent layer containing fluorescent particles immobilized by binder resin, a photoelectric conversion element panel, and a bonding layer provided between the fluorescent layer and the photoelectric conversion element panel and which is capable of obtaining sufficient bonding strength between the fluorescent layer and the bonding layer while securing a certain level of image sharpness by reduction of the thickness of the bonding layer to the minimum.

To achieve the abovementioned object, according to an aspect, a radiograph detector reflecting one aspect of the present invention comprises a fluorescent layer, a bonding layer, and a light detector disposed in this order, wherein the fluorescent layer includes fluorescent particles, first binder resin, and second binder resin, and the second binder resin contains a binder polymer identical to a bonding layer forming polymer contained in the bonding layer.

A method for manufacturing the radiograph detector according to another aspect of the present invention preferably comprises: (1) a step of forming a preceding structure which includes a preceding fluorescent layer containing fluorescent particles and first binder resin, a bonding layer, and a light detector in this order; and (2) a step of heating the preceding structure at a temperature equal to or higher than a softening temperature of the bonding layer, and allowing a bonding layer forming polymer included in the bonding layer to infiltrate the inside of the preceding fluorescent layer to form the fluorescent layer.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein.

DESCRIPTION OF THE PREFERRED EMBODIMENTS

Hereinafter, an embodiment of the present invention will be described with reference to the drawings. However, the scope of the invention is not limited to the illustrated examples.

A radiograph detector according to an embodiment of the present invention will be hereinafter specifically described.

In the context of the present specification, the term "light" refers to electromagnetic waves in a wavelength range from an ultraviolet range to an infrared range with visible light located at the center, more specifically, electromagnetic waves having wavelengths ranging from 300 nm to 800 nm. In addition, each of the terms "fluorescent substance" and "scintillator" in this context refers to a fluorescent substance which absorbs energy of received radiation such as X-rays, and emits the "light".

Furthermore, the term "height" in the context of the present specification refers to a concept expressing a position in the film thickness direction.

[Radiograph Detector]

A radiograph detector according to an embodiment of the present invention is characterized by including a fluorescent layer, a bonding layer, and a light detector disposed in this order. The fluorescent layer includes fluorescent particles, first binder resin, and second binder resin. The second binder resin contains a binder polymer identical to a bonding layer forming polymer contained in the bonding layer.

Figure 1:
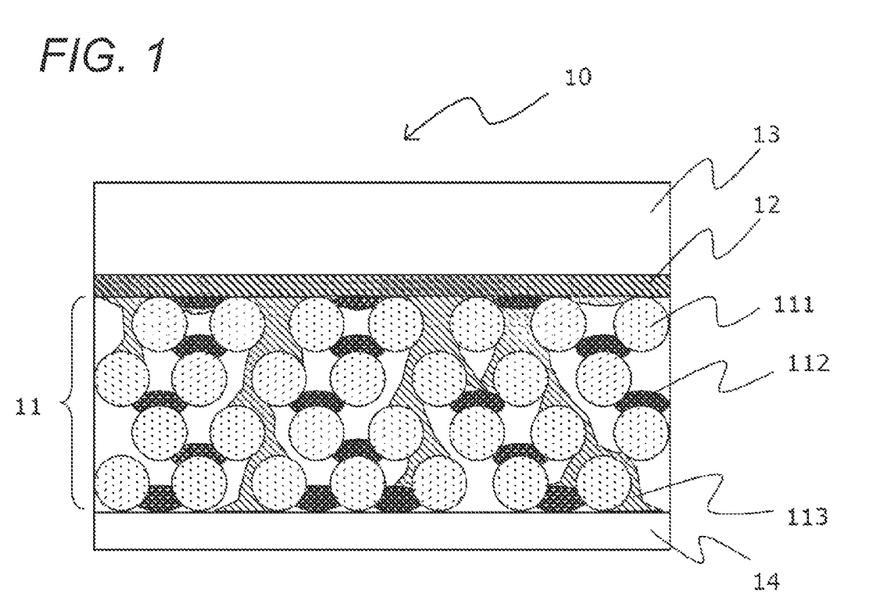
FIG. 1 is a view schematically illustrating a basic configuration of a radiograph detector according to an embodiment of the present invention.

FIG. 1 illustrates a basic configuration of a radiograph detector according to an embodiment of the present invention. As illustrated in FIG. 1, a fluorescent layer 11 of a radiograph detector 10 includes fluorescent particles 111, first binder resin 112, and second binder resin 113. According to the radiograph detector 10 of an embodiment of the present invention, a light detector 13 is attached to the upper part of the fluorescent layer 11 via a bonding layer 12.

The inventors of the present invention estimate that the radiograph detector 10 according to an embodiment of the present invention has such a structure that the bonding layer 12 and the second binder resin 113 constituting the fluorescent layer 11 are integrated with each other as illustrated in FIG. 1, and therefore consider that this structure sufficiently secures adhesive strength between the fluorescent layer and the bonding layer while achieving a certain level of image sharpness by reduction of the thickness of the bonding layer to the minimum. For allowing production of this structure, the chief component constituting the bonding layer 12 and the chief component constituting the second binder resin 113 of the fluorescent layer 11 need to be formed by an identical component. Accordingly, the second binder resin 113 constituting the fluorescent layer 11 contains a binder polymer identical to an adhesive layer forming polymer constituting the bonding layer 12.

In a typical aspect of the present invention, the radiograph detector 10 further includes a support body 14 in many cases. In this configuration, the fluorescent layer 11 is formed on the surface of the support body 14. The bonding layer 12 and the light detector 13 are disposed on the surface of the fluorescent layer 11 on the side opposite to the support body 14 side.

The respective constituent parts are hereinafter sequentially described.

(Bonding Layer)

The bonding layer 12 of the radiograph detector 10 according to an embodiment of the present invention is a layer for bonding the fluorescent layer 11 with the light detector 13. The fluorescent layer 11 and the light detector 13 will be detailed later.

According to an embodiment of the present invention, the bonding layer 12 needs to be so constructed that fluorescence emitted from the fluorescent layer 11 can pass through the bonding layer 12 and reach the light detector 13 without attenuation. In addition, according to an embodiment of the invention, the chief component constituting the bonding layer 12 and the chief component constituting the second binder resin 113 of the fluorescent layer 11 need to be formed by an identical component. For meeting both the requirements, the bonding layer 12 according to an embodiment of the invention is made of resin material. Examples of the material of the bonding layer 12 include various types of bonding agents, adhesive agents, and double sided bonding/adhesive sheets similar to examples of the corresponding material for bonding a fluorescent layer and a light detector of a conventional radiograph detector. According to an embodiment of the present invention, however, it is preferable that the material constituting the bonding layer 12 does not contain a cross-linking agent. The use of a material not containing a cross-linking agent as the material constituting the bonding layer 12 may be advantageous particularly from the viewpoint of maintaining durability under high-temperature and high-humidity conditions.

In a preferable aspect of the present invention, the bonding layer 12 may be made of resin which does not become fluid at a temperature corresponding to the use condition of the radiograph detector 10, but becomes fluid under the heated condition. For example, resin which does not become fluid at room temperature, but becomes fluid in the heated condition may be employed. According to an embodiment of the present invention, it is further preferable that the resin constituting the bonding layer 12 becomes fluid at a relatively low temperature, while not becoming fluid at a temperature corresponding the use condition of the radiograph detector 10. In this case, the constituent elements of the radiograph detector 10 other than the bonding layer 12, such as the fluorescent particles 111 and the light detector 13 are not damaged by heat. From this viewpoint, a hot-melt adhesive is employed as a particularly preferable example constituting the bonding layer 12 according to an embodiment of the present invention.

The hot-melt adhesive according to an embodiment of the present invention is an adhesive which becomes fluid at a relatively low temperature, while not becoming fluid at a temperature corresponding to the use condition of the radiograph detector 10. Specific examples of the hot-melt adhesive include such an adhesive having a melting point ranging from 60° C. to 100° C. The "melting point" in this context may be a melting point measured by differential scanning calorimetry (DSC), for example. Examples of a polymer constituting the hot-melt adhesive include ethylene-vinyl acetate copolymer resin, polyolefin resin, polyamide resin, acrylic resin, and polyurethane resin.

According to an embodiment of the present invention, the adhesive strength between the fluorescent layer 11 and the bonding layer 12 increases by the presence of the second binder resin 113. Accordingly, reduction of the thickness of the bonding layer 12 is achievable according to the radiograph detector 10 in an embodiment of the present invention in comparison with a conventional radiograph detector 90 illustrated in FIG. 4, for example. It is preferable that the thickness of the bonding layer 12 of the radiograph detector 10 ranges from 5 µm to 30 µm according to an embodiment of the invention.

(Fluorescent Layer)

The fluorescent layer 11 of the radiograph detector 10 according to an embodiment of the present invention includes the fluorescent particles 111, the first binder resin 112, and the second binder resin 113.

Fluorescent Particle

The fluorescent particles 111 of the radiograph detector 10 according to an embodiment of the present invention has a function of absorbing energy of X-rays and emitting light, as an ultimate function to be performed by the fluorescent layer 11.

The fluorescent material constituting the fluorescent particles 111 is not particularly limited, but may be arbitrary material as long as the material can convert energy of X-rays received from the outside into light. Accordingly, various types of conventional fluorescent substances may be employed as the fluorescent material. The fluorescent material constituting the fluorescent particles 111 may be used as a single material. However, the fluorescent material may contain an activating agent for obtaining sufficiently high light emission efficiency.

Examples of the fluorescent material include $CaWO_4$, $YTaO_4$, $YTaO_4$:Nb, LaOBr:Tm, $BaSO_4$:Pb, ZnS:Ag, $BaSO_4$:Eu, $YTaO_4$:Tm, BaFCl:Eu, BaF(Br,I):Eu, $Gd_2O_2S$:Tb, $Y_2O_2S$:Tb, $La_2O_2S$:Tb, $(Y,Gd)_2O_2S$:Tb, $(Y,Gd)_2O_2S$:Tb, Tm, and other known fluorescent substances. According to an embodiment of the present invention, gadolinium oxysulfide is used as a preferable example of the fluorescent material constituting the fluorescent particles 111. In this case, gadolinium oxysulfide may be constituted only by $Gd_2O_2S$, or may contain various types of activating agents such as Tb in addition to $Gd_2O_2S$ corresponding to fluorescent base material.

These examples of the fluorescent material may be used as a single material, or may contain a combination of two or more types of materials.

The average particle diameter of the fluorescent particles 111 may be arbitrarily determined within a range typically adopted for fluorescent particles for the same purpose. A preferable average particle diameter ranges from 1 µm to 20 µm (inclusive) in many cases.

In the specification of the present invention, the term "average particle diameter" of the respective fluorescent particles 111 refers to an average of "particle diameters" obtained for the 100 fluorescent particles 111, on the assumption that each maximum length of the fluorescent particles 111 measured by observation through an electron microscope corresponds to a particle diameter.

First Binder Resin

The first binder resin 112 of the radiograph detector 10 according to an embodiment of the present invention has a function of fixing the relative positions of the fluorescent particles 111 within the fluorescent layer 11, and maintaining the structure of the fluorescent layer 11.

The material constituting the first binder resin 112 having this function is not particularly limited, but may be arbitrarily determined as long as the first binder resin 112 can perform the foregoing function without deteriorating the advantages offered by an embodiment of the invention. In a typical aspect, organic polymer material is used as a preferable material constituting the first binder resin 112.

Examples of the organic polymer material include polyvinyl butylal, nitrocellulose, cellulose acetate, ethylcellulose, linear polyester, polyvinyl acetate, vinylidene chloride-vinyl chloride copolymer, vinyl chloride-vinyl acetate copolymer, polyalkyl(meth)acrylate, polycarbonate, polyurethane, cellulose acetate butyrate, polyvinyl alcohol, gelatin, polysaccharide such as dextrin, gum arabic, or other various types of organic polymer materials. Organic polymer materials constituting a fluorescent layer of a conventional image conversion screen are adoptable without causing any particular problems.

Each of these organic polymer materials may be used as a single material, or may contain a combination of two or more types of materials.

It is preferable according to an embodiment of the invention that the amount of the first binder resin 112 constituted by any of the foregoing organic polymer materials, for example, is reduced to the minimum so as to secure the largest possible volume of the fluorescent particles 111 contained in the fluorescent layer 11. On the other hand, for securing a certain level of strength of the fluorescent layer 11, it is preferable that the amount of the first binder resin 112 is sufficiently large. Accordingly, it is preferable that the amount of the first binder resin 112 ranges from 2% by weight to 12% by weight of the fluorescent particles 111 contained in the fluorescent layer 11 so as to secure both high image sharpness and a certain level of durability of the radiograph detector 10.

The first binder resin 112 may further contain a dispersant and/or a plasticizer, for example, allowed to be used for forming the fluorescent layer 11.

Second Binder Resin

The second binder resin 113 of the radiograph detector 10 according to an embodiment of the present invention has a function of strengthening the bond between the respective fluorescent particles 111 within the fluorescent layer 11, and strengthening the bond between the fluorescent layer 11 and the foregoing bonding layer 12. When the fluorescent layer 11 includes a plurality of layers, the second binder resin 113 further has a function of strengthening the bond between the plurality of layers of the fluorescent layer 11.

In a typical aspect of the present invention, the fluorescent layer 11 includes the fluorescent particles 111, the first binder resin 112, and voids formed between the fluorescent particles 111 and the first binder resin 112, as illustrated in FIG. 1. The inventors of the present invention estimate that the second binder resin 113 in the fluorescent layer 11 is present in such a state as to expand from the bonding layer 12 toward the interior of the fluorescent layer 11 while penetrating these voids, thereby bonding the respective fluorescent particles 111, and further bonding the bonding layer 12 and the fluorescent particles 111.

Figure 4:
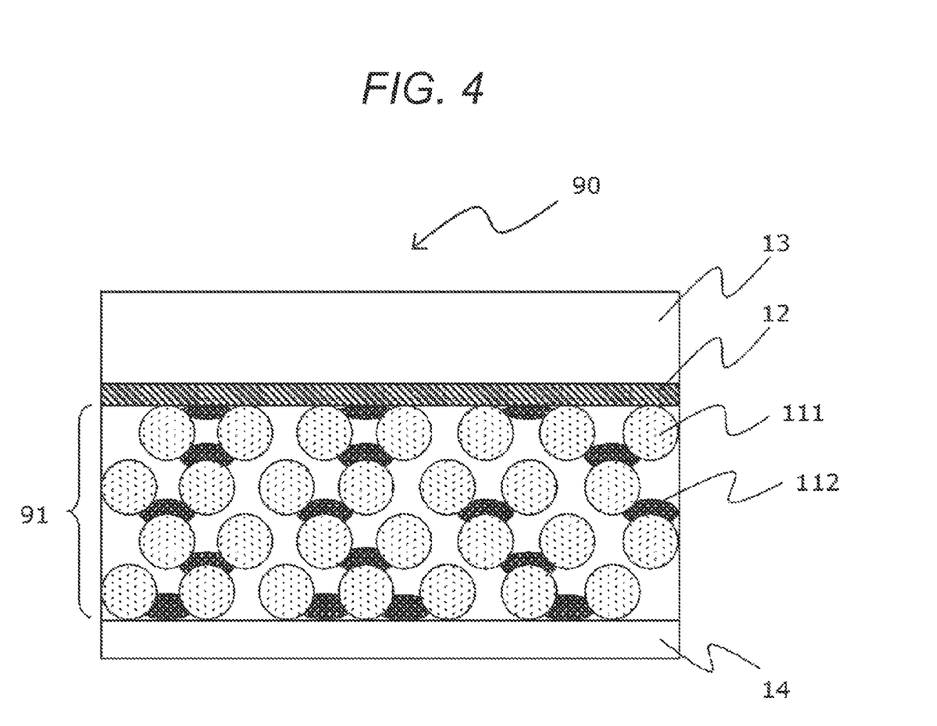
FIG. 4 is a view schematically illustrating a basic configuration of a conventional radiograph detector.

According to an embodiment of the present invention, the presence of the second binder resin 113 in the fluorescent layer 11 increases the bonding strength between the fluorescent layer 11 and the bonding layer 12, and the bonding strength between the plurality of layers constituting the fluorescent layer 11, if any, in comparison with the conventional radiograph detector 90 not including the second binder resin 113 as illustrated in FIG. 4, for example.

In this case, the chief component of the second binder resin 113 is identical to the chief component of the bonding layer 12 discussed above according to an embodiment of the present invention. More specifically, according to an embodiment of the present invention, the second binder resin 113 contains the same binder polymer as the bonding layer forming polymer constituting the bonding layer 12.

Particularly, when the radiograph detector 10 according to an embodiment of the present invention is produced by a manufacturing method to be described later, the second binder resin 113 is constituted by substantially the same components as the components constituting the bonding layer 12. As discussed earlier in the section of "bonding layer", the bonding layer 12 in a preferable aspect of the present invention is constituted by a hot-melt adhesive, wherefore it is preferable that the second binder resin 113 is constituted by a hot-melt adhesive similarly to the bonding layer 12. The foregoing examples presented in the section of "bonding layer" are applicable to specific examples of the bonding layer forming polymer constituting the bonding layer 12. According to an embodiment of the present invention, it is preferable that the second binder resin 113 does not contain a cross-linking agent similarly to the bonding layer 12.

According to an embodiment of the present invention, the second binder resin 113 may be either identical to the first binder resin 112, or different from the first binder resin 112.

Layer Constitution of Fluorescent Layer

The filing ratio of the fluorescent particles 111 within the fluorescent layer 11 is not particularly limited. It is preferable that this rate ranges from 30% to 80% (inclusive).

The layer thickness of the fluorescent layer 11 preferably ranges from 100 μm to 600 μm (inclusive).

Figure 2:
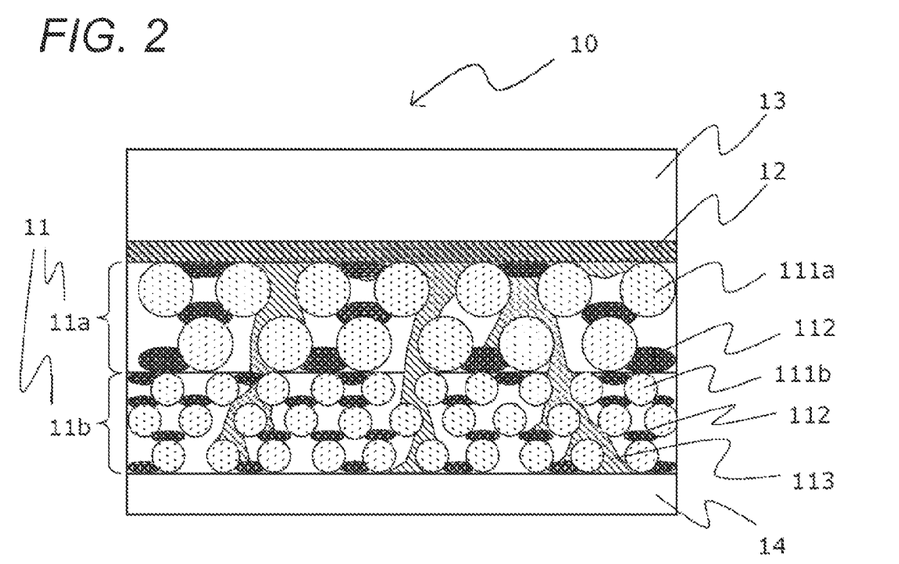
FIG. 2 is a view illustrating a configuration example of the radiograph detector according to an embodiment of the present invention.

The fluorescent layer 11 may be constituted by a single layer, or may contain two or more layers as illustrated in FIG. 2. In this case, the layer constituting the fluorescent layer 11 may contain a single fluorescent material, or two or more types of fluorescent materials. When the fluorescent layer 11 contains a plurality of layers, it is preferable that the total thickness of the respective fluorescent layers constituting the fluorescent layer 11 ranges from 100 μm to 600 μm (inclusive).

When the fluorescent layer 11 contains a plurality of layers, the plurality of layers may be different for each in composition, average particle diameter, particle diameter distribution or other conditions of the fluorescent particles. In a preferable aspect of the present invention, the fluorescent layer 11 includes a plurality of layers different for each in average particle diameter of the fluorescent particles 111.

When the fluorescent layer 11 includes the plurality of layers different for each in average particle diameter of the fluorescent particles 111, the respective layers of the fluorescent layer 11 may be disposed such that the average particle diameter of the fluorescent particles 111 gradually increases toward the light detector 13, or gradually decreases toward the light detector 13. FIG. 2 illustrates an example of the radiograph detector 10 which includes the fluorescent particles 111 disposed such that the average particle diameter of the fluorescent particles 111 gradually increases toward the light detector 13. According to the radiograph detector 10 illustrated in FIG. 2, the fluorescent layer 11 includes a first fluorescent layer 11a bonded to the light detector 13 via the bonding layer 12, and a second fluorescent layer 11b disposed on the side opposite to the light detector 13 as viewed from the first fluorescent layer 11a. The average particle diameter of fluorescent particles 111a constituting the first fluorescent layer 11a is larger than the average particle diameter of fluorescent particles 111b constituting the second fluorescent layer 11b. When the respective fluorescent layers constituting the fluorescent layer 11 are disposed such that the average particle diameter of the fluorescent particles 111 gradually increases toward the light detector 13 as in this case, light emission luminance further improves. Higher luminance thus realized can increase the sensitivity of an imaging system and the sharpness of an image for a radiograph formed by a combination of photoelectric conversion elements. Accordingly, a preferable effect of image quality improvement is achievable.

Even in case of the fluorescent layer 11 constituted by a single layer, the filing ratio can be raised by increasing the particle diameter ratio when a combination of two or more types of fluorescent particles 111 different in average particle diameter are contained in the layer of the fluorescent layer 11, for example. Light emission luminance increases at a larger filling ratio, wherefore the sensitivity of the imaging system and the image sharpness can improve.

Formation Method of Fluorescent Layer

Figure 3A:
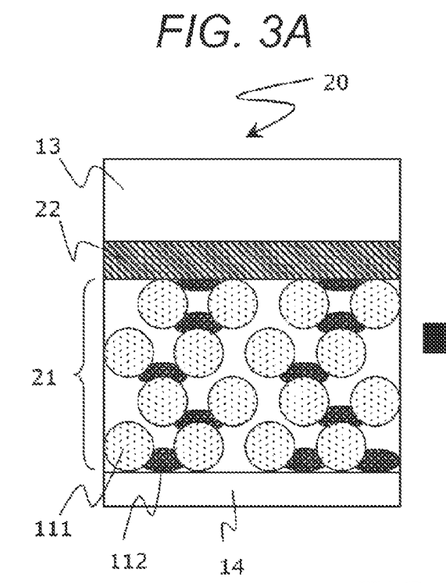
FIGS. 3A to 3C are views illustrating a radiograph detector manufacturing method according to an embodiment of the present invention.

A method for forming the fluorescent layer 11 according to an embodiment of the present invention is not particularly limited, but may be arbitrarily determined as long as the structure of the fluorescent layer 11 specified in an embodiment of the present invention can be produced. In a preferable aspect of the present invention, the fluorescent layer 11 may be formed by steps (1) and (2) described in the section of "radiograph detector manufacturing method" which will be detailed later. According to this method, a preceding fluorescent layer 21 constituted by the fluorescent particles 111 and the first binder resin 112 is initially formed by a conventional appropriate method, and combined with the light detector 13 to form a preceding structure 20 constituted by the preceding fluorescent layer 21 and the light detector 13 with the bonding layer 12 interposed therebetween as illustrated in FIG. 3A. The preceding structure 20 thus produced is heated at a temperature equal to or higher than the softening temperature of the bonding layer 12 to allow the constituent components of the bonding layer 12 to be melted and introduced into the preceding fluorescent layer 21 for completion of the fluorescent layer 11.

(Light Detector)

The light detector 13 according to an embodiment of the present invention has a function of converting emission light generated from the fluorescent layer 11 into an electric signal, and outputting the signal to the outside. The light detector 13 may be constituted by a conventional light detector.

The configuration of the light detector 13 according to an embodiment of the present invention is not particularly limited. The light detector 13 is in many cases constituted by a photoelectric conversion element panel. While the detailed structure is not shown in the figure, the photoelectric conversion element panel employed herein is configured to include a substrate, an image signal output layer, and a photoelectric conversion element laminated in this order.

The photoelectric conversion element has a function of absorbing light emitted from the fluorescent layer 11, and converting the light into charge. The photoelectric conversion element may have an arbitrary specific structure as long as this function is achievable. For example, the photoelectric conversion element adopted in an embodiment of the present invention may include a transparent electrode, a charge generating layer excited by received light and generating charge, and a counter electrode. Each of the transparent electrode, the charge generating layer, and the counter electrode may be constituted by a conventional component. The photoelectric conversion element used in an embodiment of the present invention may be constituted by an appropriate photo-sensor. For example, the photoelectric conversion element may be constituted by a plurality of photodiodes arranged two-dimensionally, or a two-dimensional photo-sensor such as a Charge Coupled Devices (CCD) and a Complementary Metal Oxide Semiconductor (CMOS) sensor.

The image signal output layer has a function of accumulating charge obtained by the photoelectric conversion element, and outputting a signal generated based on the accumulated charge. The image signal output layer may have an arbitrary specific structure. For example, the image signal output layer may include a capacitor corresponding to a charge accumulating element for accumulating charge generated by the photoelectric conversion element for each pixel, and a transistor corresponding an image signal output element for outputting accumulated charge as a signal. Preferable examples of the transistor include a TFT (thin film transistor).

The substrate functions as a support body of the radiograph detector, and may be constituted by a part similar to the support body 14 discussed above.

Accordingly, photoelectric conversion element panels structured in various manners as discussed herein are allowed to be employed as the light detector 13 according to an embodiment of the present invention. For example, as described in Examples of the present application to be detailed later, a photoelectric conversion element panel which includes a plurality of photodiodes and a plurality of TFT elements formed on a glass substrate may be employed as the photoelectric conversion element panel constituting the light detector 13.

The photoelectric conversion element panel constituting the light detector 13 may further include a memory unit for storing an image signal generated based on information about intensity and position of X-rays converted into an electric signal, a power supply unit for supplying power necessary for driving the photoelectric conversion element panel, a communication output unit for extracting image information to the outside, and other various known components allowed to be included in a photoelectric conversion element panel constituting a known radiograph detector.

(Support Body)

The support body 14 of the radiograph detector 10 according to an embodiment of the present invention is provided as a base on which the fluorescent layer 11 is formed, and performs a function of supporting the structure of the fluorescent layer 11.

The fluorescent layer 11 according to an embodiment of the present invention is bonded to the light detector 13 via the bonding layer 12, wherefore the structure of the fluorescent layer 11 is supported by the light detector 13. Accordingly, the support body 14 is not necessarily an essential component in the radiograph detector 10 according to an embodiment of the present invention. However, under the situation that the fluorescent layer 11 is initially formed and then bonded to the light detector 13 in many cases for convenience of manufacturing steps of the radiograph detector, the structure of the fluorescent layer 11 needs to be supported by the support body 14 during the period before bonding to the light detector 13. Accordingly, the radiograph detector 10 according to an embodiment of the present invention includes the support body 14 as well in many cases.

Examples of the material constituting the support body 14 include polyolefin resin such as polypropylene and polyethylene, polyamide, polyimide, polyvinyl chloride, polystyrene resin, polyacrylic resin, polycarbonate resin, and polyester resin. Among these materials, polyethylene terephthalate, polybutylene terephthalate, polyethylene-2,6-naphthalate, and other polyester resin or polyimide resin are particularly preferable in view of durability, heat resistance, and chemical stability, for example.

It is preferable that the thickness of the support body 14 ranges from 30 µm to 300 µm in view of handling and X-ray transmission.

In addition, it is preferable that the radiograph detector 10 further includes a reflection layer. This reflection layer is a layer which reflects light emitted from the fluorescent layer 11 as fluorescence and traveling toward the side opposite to the light detector 13, and guides the reflected light toward the light detector 13.

In an aspect of the present invention, the support body 14 may function as a reflection layer. In this case, the support body 14 may be constituted material containing a light reflection substance such as titanium dioxide and calcium carbonate, or bubbles in the resin. The support body 14 in this aspect may be formed by a usual method.

In another aspect of the present invention, the reflection layer may be a layer separate from the support body 14. In this case, the reflection layer may be disposed on the support body 14, i.e., between the support body 14 and the fluorescent layer 11. In this aspect, the reflection layer may be constituted by a light reflection substance such as titanium dioxide and calcium carbonate, or may be constituted by evaporated metal film made of Al, Ag, Cr, Cu, Ni, Ti, Mg, Rh, Pt, Au, or other materials. The reflection layer of this type may be provided on the support body 14 by direct positioning of the light reflection substance. Alternatively, for forming the reflection layer, an application solution containing the light reflection substance may be prepared, applied to the support body, and dried thereon. Instead, the light reflection layer may be formed by evaporation of metal such as Al, Ag, Cr, Cu, Ni, Ti, Mg, Rh, Pt, and Au.

The reflection layer thus formed may have a film thickness similar to a film thickness of a reflection layer included in an ordinary radiograph detector. The reflection layer may be constituted by a single layer, or may contain two or more layers.

(Radiograph Detector Manufacturing Method)

A method for manufacturing the radiograph detector is not particularly limited, but may be an arbitrary method as long as the foregoing configuration can be produced.

A preferable method for manufacturing the radiograph detector include the following steps (1) and (2):

(1) a step of forming a preceding structure which includes a preceding fluorescent layer containing fluorescent particles and first binder resin, a bonding layer, and a light detector in this order; and (2) a step of heating the preceding structure at a temperature equal to or higher than the softening temperature of the bonding layer, and allowing a bonding layer forming polymer constituting the bonding layer to infiltrate the inside of the preceding fluorescent layer to convert the preceding fluorescent layer into the fluorescent layer.

A radiograph detector manufacturing method according to an embodiment of the present invention is hereinafter described with reference to FIGS. 3A to 3C.

Step (1)

Step (1) of the manufacturing method according to an embodiment of the present invention forms the preceding structure 20 which includes the preceding fluorescent layer 21 constituted by the fluorescent particles 111 and the first binder resin 112, a bonding layer 22, and the light detector 13 in this order (FIG. 3A).

In an aspect of the present invention, step (1) includes the following steps:

(1a-1) a step of forming the preceding fluorescent layer 21 constituted by the fluorescent particles 111 and the first binder resin 112; and (1a-2) a step of positioning the light detector 13 on the surface of the preceding fluorescent layer 21 via the bonding layer 22.

Initially, step (1a-1) forms the preceding fluorescent layer 21 constituted by the fluorescent particles 111 and the first binder resin 112. In step (1a-1), the preceding fluorescent layer 21 may be formed by a conventional method. For example, the preceding fluorescent layer 21 may be formed by applying fluorescent application liquid containing the fluorescent particles 111 and the first binder resin 112 to an appropriate substrate, and drying the fluorescent application liquid on the substrate.

For example, fluorescent application liquid having appropriate viscosity is prepared by mixing an appropriate amount of the fluorescent particles 111 with the first binder resin 112, and adding an organic solvent to this mixture. The prepared fluorescent application liquid is applied to an appropriate substrate by a conventional application method such as a method using a knife coater or a roll coater, and dried on the substrate to form the preceding fluorescent layer 21.

In this case, examples of the organic solvent allowed to be used for preparation of the fluorescent application liquid include methyl ethyl ketone, ethanol, methyl ethyl ether, butyl acetate, ethyl acetate, methyl ether, xylene, and toluene.

A dispersant such as phthalic acid and stearic acid, and a plasticizer such as triphenyl phosphate and diethyl phthalate may be added to the fluorescent application liquid as necessary.

The substrate used for formation of the preceding fluorescent layer 21 may be a substrate constituting the support body 14. When the substrate of the preceding fluorescent layer 21 is a substrate constituting the support body 14, appropriate layers such as the reflection layer may be formed on the substrate in advance.

The preceding fluorescent layer 21 according to an embodiment of the present invention may be constituted by a single layer, or may contain a plurality of layers, similarly to the fluorescent layer 11 to be included in the radiograph detector 10. When the preceding fluorescent layer 21 contains a plurality of layers such as layers different in average particle diameter of the fluorescent particles 111, the respective layers are formed step by step.

The preceding fluorescent layer 21 may have composition distribution and/or particle diameter distribution inclined in the film thickness direction in each of the constituent layers. In this case, distribution of the average particle diameter of the fluorescent particles 111 included in each of the layers may be inclined in the height direction by adjusting combinations of the particle diameters of the fluorescent particles 111, the viscosity of the fluorescent application liquid, and the drying speed after application in appropriate manners. For example, fluorescent application liquid which has relatively low viscosity and contains a fluorescent material mixture constituted by two or more types of the fluorescent particles 111 different in average particle diameter is initially prepared, and applied to a substrate. Then, the fluorescent application liquid is left at rest, and dried at a low speed. The preceding fluorescent layer 21 thus formed (hereinafter referred to as "inclined particle diameter preceding fluorescent layer") contains the fluorescent particles 111 arranged in such an order that the particle diameters of the respective fluorescent particles 111 gradually decrease from the side contacting the substrate toward the surface side.

The subsequent step (1a-2) positions the light detector 13 on the surface of the preceding fluorescent layer 21 via the bonding layer 22. At the time of positioning in step (1a-2), the substrate used for formation of the preceding fluorescent layer 21 may be continuously used as the support body 14 without release from the preceding fluorescent layer 21, or may be released from the preceding fluorescent layer 21 prior to bonding to the light detector 13 if possible. The bonding layer 22 may be constituted by the bonding agent, adhesive agent, or double sided bonding/adhesive sheet discussed in the foregoing section of "bonding layer". When the light detector 13 is constituted by the photoelectric conversion element panel, it is preferable that the photoelectric conversion element (not shown) side of the photoelectric conversion element panel faces to the bonding layer 22. When the preceding fluorescent layer 21 is constituted by the "inclined particle diameter preceding fluorescent layer" discussed above, the light detector 13 may be disposed in such a position that the surface of the preceding fluorescent layer 21 on the side containing the large-diameter fluorescent particles faces to the bonding layer 22 so as to produce the preceding structure 20 which includes the preceding fluorescent layer 21 containing the fluorescent particles 111 disposed such that the average particle diameters gradually increase toward the light detector 13.

According to the manufacturing method of an embodiment of the present invention, the thickness of the bonding layer 22 provided on the surface of the preceding fluorescent layer 21 is not particularly limited, but may be arbitrarily determined as long as the produced radiograph detector 10 is allowed to include a sufficient amount of the second binder resin 113, and allowed to include the bonding layer 12 having the sufficient and minimum thickness for obtaining sufficient bonding strength. It is preferable that the thickness of the bonding layer 22 ranges from 5 μm to 30 μm.

According to an embodiment of the present invention, step (1) may be executed by forming the preceding fluorescent layer 21 on the light detector 13 via the bonding layer 22 if possible, instead of executing steps (1a-1) and (1a-2).

Step (2)

Figure 3B:
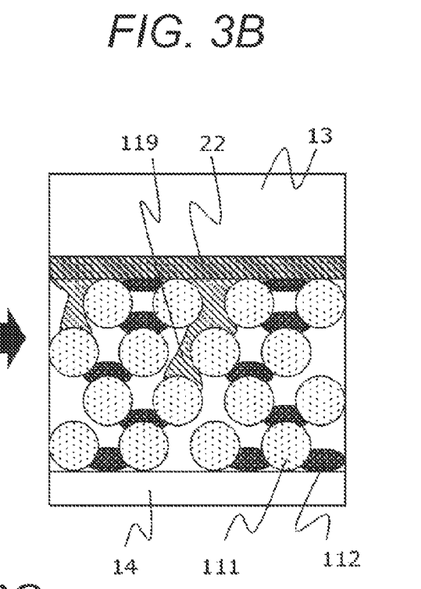
Figure 3C:
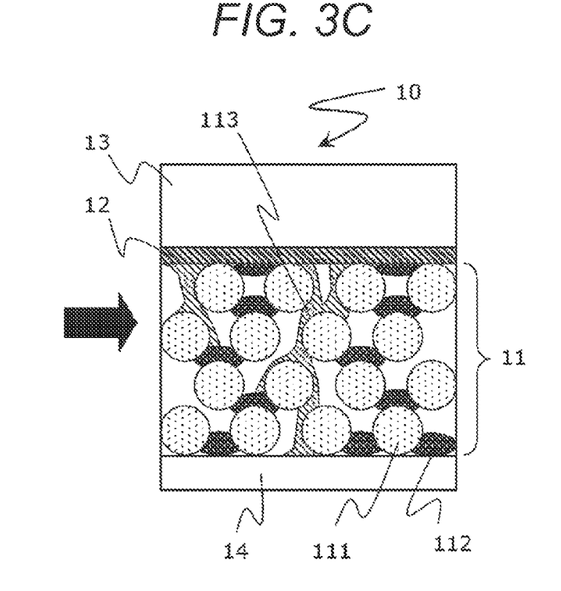

According to the manufacturing method of an embodiment of the present invention, step (2) heats the preceding structure 20 produced in step (1) at a temperature equal to or higher than the softening temperature of the bonding layer 22, and allows a bonding layer forming polymer constituting the bonding layer 22 to infiltrate the inside of the preceding fluorescent layer 21 to convert the preceding fluorescent layer 21 into the fluorescent layer 11 (FIGS. 3B and 3C).

By this step, a bonding layer forming polymer 119 having entered the inside of the preceding fluorescent layer 21 forms the second binder resin 113 in the fluorescent layer 11.

It is preferable that the heating temperature in step (2) is 5° C. to 20° C. higher than the softening temperature of the bonding layer 22. The specific heating temperature varies in accordance with types of resin constituting the bonding layer 22. For example, this temperature may lie in the range from 70° C. to 120° C.

At the time of heating in step (2), it is preferable that the heating is executed under the decompressed environment or load-applied environment. In case of the decompressed environment, it is preferable that the heating in step (2) is executed under the vacuum degree in the range from 1 Pa to 50 Pa. In this aspect, a pressure difference is produced between the inside of the preceding fluorescent layer 21 and the outside of the preceding structure 20 as a result of the decompressed condition within the preceding fluorescent layer 21. Under the condition of this pressure difference, the light detector 13 presses a part of resin constituting the bonding layer 22 out of the bonding layer 22, whereby the pressed part of the resin enters the inside of the preceding fluorescent layer 21. On the other hand, in case of the load-applied environment, it is preferable that the heating in step (2) is executed under application of a load in the range from 0.1 MPa to 1 MPa to the preceding structure 20 in the film thickness direction.

In either of the cases, it is preferable that the heating time in step (2) ranges from 1 minute to 30 minutes.

EXAMPLE

Examples of the present invention are hereinafter described in detail. However, the present invention is not limited to these examples.

Example 1

(Support Body)

A support body of a radiographic conversion panel was constituted by Lumirror (registered trademark) E20 (manufactured by Toray Industries Inc.) made of a while PET film having a thickness of 188 μm.

This support body is hereinafter referred to as "PET support body" as well.

(Formation of Preceding Fluorescent Layer)

A preceding fluorescent layer was formed on the support body in the following manner.

Polyester resin (Toyobo Vylon (registered trademark) 530) was added to a mixed solvent of methyl ethyl ketone, toluene, and cyclohexanone. The resultant mixture was dispersed by a propeller mixer to prepare application liquid containing 77% effective components as a binder solution.

This binder solution and $Gd_2O_2S$:Tb fluorescent substance having an average particle diameter of 5 μm were mixed at a ratio of 90:10 percent by volume as solid components, and dispersed by a propeller mixer to prepare fluorescent application liquid C1.

The fluorescent application liquid C1 was applied to the PET support body using a doctor blade, and dried at 80° C. for 20 minutes to produce a preceding fluorescent layer (1) having a thickness of 240 μm.

According to Example 1, therefore, a preceding fluorescent layer having a total thickness of 240 μm and constituted by the preceding fluorescent layer (1) was produced.

(Photoelectric Conversion Element Panel)

A planar light receiving element of AeroDR (FPD manufactured by Konica Minolta Co, Ltd.) was used as a photoelectric conversion element panel. This planar light receiving element is constituted by a plurality of photodiodes and a plurality of TFT elements disposed on a glass substrate.

(Manufacture of Hot-Melt Sheet)

Ethylene-vinyl acetate copolymer (melting point: 70° C.) was melted at 200° C., whereafter a hot-melt sheet having a film thickness of 15 μm was produced by using an extrusion coater.

(Attachment of Photoelectric Conversion Element Panel to Preceding Fluorescent Layer: Formation of Preceding Structure)

The photoelectric conversion element panel was attached to the preceding fluorescent layer in the following manner.

The preceding fluorescent layer and the planar light receiving element of AeroDR (FPD manufactured by Konica Minolta Co, Ltd.) were affixed to each other via the bonding layer (hot-melt sheet noted above).

(Preceding Structure Heating Process)

A preceding structure obtained by the attachment step was heated under pressure of 0.1 MPa, at 75° C., and for 15 minutes.

Example 2

A radiograph detector was produced by performing processes similar to the corresponding processes of Example 1 were executed, except for the step of "formation of preceding fluorescent layer" which was performed in the following manner.

(Formation of Preceding Fluorescent Layer)

The fluorescent application liquid C1 was initially applied to the PET support body and dried thereon by a method similar to the foregoing method for formation of the preceding fluorescent layer (1) to form a preceding fluorescent layer (2b) having a thickness of 120 μm and containing $Gd_2O_2S:Tb$ fluorescent substance having an average particle diameter of 5 μm.

Fluorescent application liquid C2 was prepared by a method similar to the foregoing method for preparing the fluorescent application liquid C1 except that $Gd_2O_2S:Tb$ fluorescent substance having an average particle diameter of 15 μm was used instead of $Gd_2O_2S:Tb$ fluorescent substance having an average particle diameter of 5 μm.

Then, the fluorescent application liquid C2 was applied to the preceding fluorescent layer (2b) and dried thereon by a method similar to the foregoing method for forming the preceding fluorescent layer (2b) to form a preceding fluorescent layer (2a) having a thickness of 120 μm and containing $Gd_2O_2S:Tb$ fluorescent substance having an average particle diameter of 15 μm.

According to Example 2, therefore, a preceding fluorescent layer having a total thickness of 240 μm and constituted by two layers of the preceding fluorescent layer (2a) and the preceding fluorescent layer (2b) was produced.

Comparative Example 1

A radiograph detector was produced by performing processes similar to the processes executed in Example 1 for the preceding structure. However, this preceding structure was not heated.

Comparative Example 2

A radiograph detector was produced by performing processes similar to the processes executed in Example 2 for the preceding structure. However, this preceding structure was not heated.

(Evaluation of Bonding Strength)

Bonding strength of an interface between a preceding fluorescent body and a bonding layer, and bonding strength between respective layers in a multilayered preceding fluorescent body are detectable based on image non-uniformity caused by a light emission output difference between a delaminated portion and a non-delaminated portion. Accordingly, the respective bonding strengths were evaluated by the following method.

Pressure of 6 MPa was applied to the X-ray applied side of each of the radiograph detectors for one minute, and an image change after application of pressure in a pressure application range was evaluated based on the following criteria by each score.

5: image non-uniformity not contained (image non-uniformity causing problems in image diagnosis is not recognizable)

4: slight image non-uniformity contained (image non-uniformity causes substantially no problem in image diagnosis, but a time is required for image diagnosis)

3: medium image non-uniformity contained (image non-uniformity causes substantially no problem in image diagnosis, but judgment by a plurality of radiologists is required)

2: apparent image non-uniformity possibly leading to erroneous diagnosis in image diagnosis is recognizable 1: considerable image non-uniformity leading to erroneous diagnosis with extremely high possibility in image diagnosis is recognizable Table 1 shows results of the respective radiograph detectors. Concerning the radiograph detectors according to Example 2 and Comparative Example 2 each including a plurality of fluorescent layers, the fluorescent layer disposed closest to the photoelectric conversion element panel, such as the fluorescent layer produced from the preceding fluorescent layer (2a), is expressed as a "first fluorescent layer", while the fluorescent layer disposed closer to the support body, such as the fluorescent layer produced from the preceding fluorescent layer (2b), is expressed as a "second fluorescent layer" in Table 1.

TABLE 1

| EXAMPLE/ REFERENCE EXAMPLE | LAYER CONFIGURATION | FIRST FLUORESCENT LAYER ||| SECOND FLUORESCENT LAYER ||| FIRST BINDER | SECOND BINDER | EFFECT BONDING STRENGTH |
|---|---|---|---|---|---|---|---|---|---|---|
| | | MATERIAL OF FLUORESCENT PARTICLE | AVERAGE PARTICLE DIAMETER OF FLUORESCENT PARTICLE | LAYER THICKNESS | MATERIAL OF FLUORESCENT PARTICLE | AVERAGE PARTICLE DIAMETER OF FLUORESCENT PARTICLE | LAYER THICKNESS | | | |
| EXAMPLE 1 | SINGLE LAYER | $Gd_2O_2S_2:Tb$ | 5 μm | 240 μm | — | — | — | PRESENT | PRESENT | 5 |
| EXAMPLE 2 | DIFFERENT PARTICLE DIAMETER TWO LAYERS | $Gd_2O_2S_2:Tb$ | 15 μm | 120 μm | $Gd_2O_2S_2:Tb$ | 5 μm | 120 μm | PRESENT | PRESENT | 5 |
| COMPARATIVE EXAMPLE 1 | SINGLE LAYER | $Gd_2O_2S_2:Tb$ | 5 μm | 240 μm | — | — | — | PRESENT | ABSENT | 2 |
| COMPARATIVE EXAMPLE 2 | DIFFERENT PARTICLE DIAMETER TWO LAYERS | $Gd_2O_2S_2:Tb$ | 15 μm | 120 μm | $Gd_2O_2S_2:Tb$ | 5 μm | 120 μm | PRESENT | ABSENT | 1 |

Although the present invention has been described and illustrated in detail, it is clearly understood that the same is by way of illustrated and example only and is not to be taken by way of limitation, the scope of the present invention being interpreted by terms of the appended claims.

What is claimed is:

1. A radiograph detector comprising:
   a fluorescent layer, a bonding layer, and a light detector disposed in this order, wherein the fluorescent layer includes fluorescent particles, a first binder resin, and a second binder resin, and
   the second binder resin contains a binder polymer identical to a bonding layer forming polymer contained in the bonding layer.

2. The radiograph detector according to claim 1, wherein the second binder resin includes a hot-melt adhesive.

3. The radiograph detector according to claim 1, wherein neither the bonding layer nor the second binder resin contains a cross-linking agent.

4. The radiograph detector according to claim 1, wherein the fluorescent layer includes a plurality of layers different from each other in average particle diameter of the contained fluorescent particles (on the assumption that the average particle diameter is an average of the particle diameters of the 100 fluorescent particles when the particle diameter is defined as the maximum length of each of the fluorescent particles measured by observation through an electron microscope).

5. The radiograph detector according to claim 1, wherein each of the fluorescent particles contains gadolinium oxysulfide.

6. A method for manufacturing the radiograph detector according to claim 1, the method comprising:
   (1) a step of forming a preceding structure which includes a preceding fluorescent layer containing fluorescent particles and first binder resin, a bonding layer, and a light detector in this order; and
   (2) a step of heating the preceding structure at a temperature equal to or higher than a softening temperature of the bonding layer, and allowing a bonding layer forming polymer included in the bonding layer to infiltrate the inside of the preceding fluorescent layer to form the fluorescent layer.

* * * * *